(12) United States Patent
Kishi

(10) Patent No.: US 7,515,647 B2
(45) Date of Patent: Apr. 7, 2009

(54) DIGITAL FREQUENCY CONVERTER

(75) Inventor: Takahiko Kishi, Yokohama (JP)

(73) Assignee: Samsung Electronics Co., Ltd (KR)

( * ) Notice: Subject to any disclaimer, the term of this patent is extended or adjusted under 35 U.S.C. 154(b) by 603 days.

(21) Appl. No.: 10/996,729

(22) Filed: Nov. 24, 2004

(65) Prior Publication Data

US 2005/0117662 A1   Jun. 2, 2005

(30) Foreign Application Priority Data

Nov. 28, 2003   (JP)   ............................. 2003-398913
Oct. 25, 2004   (KR)   ....................... 10-2004-0085231

(51) Int. Cl.
*H04L 27/00*   (2006.01)
*H04B 1/02*    (2006.01)
(52) U.S. Cl. ......................................... 375/295; 455/91
(58) Field of Classification Search ................ 375/316, 375/350, 302, 308, 295, 137, 147, 346, 375; 348/607, 659; 455/130, 20, 91, 131, 190.1, 455/313–314, 323; 708/313
See application file for complete search history.

(56) References Cited

U.S. PATENT DOCUMENTS

| | | | |
|---|---|---|---|
| 4,176,319 A | 11/1979 | Kahn | |
| 4,972,440 A | 11/1990 | Ernst et al. | |
| 5,705,959 A | 1/1998 | O'Loughlin | |
| 6,043,707 A | 3/2000 | Budnik | |
| 6,621,366 B1 | 9/2003 | Gentile | |
| 6,958,782 B2* | 10/2005 | Kishi | ........................ 348/607 |
| 7,047,264 B2* | 5/2006 | Kishi | ........................ 708/313 |
| 7,336,721 B2* | 2/2008 | Lee et al. | ..................... 375/295 |

FOREIGN PATENT DOCUMENTS

| | | |
|---|---|---|
| EP | 0 817 369 | 1/1998 |
| EP | 1 039 628 | 9/2000 |
| GB | 2 363 535 | 12/2001 |

OTHER PUBLICATIONS

Pasko et al., High-Performance Flexible All-Digital Quadrature Up And Down Converter Chip, Mar. 2003, IEEE Journal of Solid-State Circuits, vol. 36, Issue 3, pp. 408-416.*

* cited by examiner

*Primary Examiner*—Tesfaldet Bocure
*Assistant Examiner*—Lawrence B Williams
(74) *Attorney, Agent, or Firm*—The Farrell Law Firm, PC

(57) ABSTRACT

A digital frequency converter is provided that maintains a high power efficiency in an EER scheme despite the inclusion of digital signal processing. An inputted modulated signal is converted into phase information and amplitude information of a polar coordinate type. The amplitude information is outputted as amplitude information of the digital frequency converter. Meanwhile, phase change of a frequency f2, which is outputted from an accumulator, corresponding to lower 'Q' figures of phase data PD for frequency conversion is added to the phase information by an adder. In addition, a sampling frequency of the phase information outputted from the adder is upsampled by an interpolator, and also, phase change of a frequency f3, is converted into a phase-modulated signal of an orthogonal coordinate type, and then outputted as phase information of the digital frequency converter.

8 Claims, 9 Drawing Sheets

PHASE DATA FOR FREQUENCY CONVERSION

DIGITAL FREQUENCY CONVERTER

PRIORITY

This application claims priority to an application entitled "Digital Frequency Converter" filed in the Japan Patent Office on Nov. 28, 2003 and assigned Serial No. 2003-398913, and filed in the Korean Intellectual Property Office on Oct. 25, 2004 and assigned Serial No. 2004-85231, the contents of both incorporated herein by reference.

BACKGROUND OF THE INVENTION

1. Field of the Invention

The present invention relates to a digital frequency converter for converting the frequency of a signal using digital signal processing.

2. Description of the Related Art

EER (Envelope Elimination and Restoration) is one of many conventional signal processing schemes used to improve efficiency and reduce power consumption in processing a linearly modulated signal, such as a single-sideband (SSB) modulated signal, for transmission (e.g., referring to the specification of U.S. Pat. No. 4,176,319). The EER scheme converts a linearly modulated signal into phase information and amplitude information of polar coordinates. The phase amplitude information is processed independently. Resulting distortion is small, so the EER scheme is considered an effective transmission scheme with excellent efficiency. However, in analog signal processing by EER, a large error may occur when a linearly modulated signal is converted into a polar coordinate signal. It is impossible to achieve good power efficiency in combining the phase information and the amplitude information, so it is difficult to put the EER scheme to practical use.

Recently, however, with the development of digital signal processing techniques, a digital signal can be processed at high speeds, so that conversion of a linearly modulated signal into a polar coordinate signal occurs with only a small error. Further, amplifiers, such as class D, class E, and class F amplifiers, have excellent power efficiency, making it possible to put the EER scheme with a low distortion characteristic and a high power efficiency characteristic to practical use (e.g., referring to the specification of U.S. Pat. No. 5,705,959).

Under the EER scheme, a polar coordinate signal converted from a band-limited orthogonal coordinate signal has a relatively wider band, so a high sampling frequency is necessary to prevent aliasing from occurring in the converted polar coordinate signal. To this end, a method of obtaining a high sampling frequency was developed that involves performing interpolation of an orthogonal coordinate signal before it is converted into a polar coordinate signal (e.g., referring to the specification of U.S. Pat. No. 4,972,440).

In addition, frequency conversion may be executed by processing analog signals in a phase modulator as disclosed in U.S. Pat. No. 4,972,440. Frequency conversion may also be executed using complex processing by digital signal processing as shown in FIG. 9. To be specific, FIG. 9 is a block diagram illustrating a digital frequency converter for executing frequency conversion using complex processing by digital signal processing. Modulation signals MOD_I and MOD_Q are inputted to a phase detector 52 through a filter 51. Phase information is extracted from the MOD_I and MOD_Q by the phase detector 52. Then, a numeral control oscillator (NCO) 53 is controlled by the extracted phase information, thereby generating a polar coordinate phase modulation signal.

Then, Np-time upsampling is executed by an interpolator 54. Frequency conversion is executed in a complex mixer 56 by a signal outputted from an NCO 55 as a function of a desired frequency. The resulting orthogonal coordinate phase modulation signals Phase_I and Phase_Q are output from the NCO 55. In addition, the modulation signals MOD_I and MOD_Q are input to an amplitude detector 57 through the filter 51. Amplitude information Amp is extracted and output from the modulation signals MOD_I and MOD_Q by the amplitude detector 57.

However, when the sampling frequency of a signal increases to the sampling frequency of a D/A converter by interpolation as described in U.S. Pat. No. 4,972,440, power consumption increases according to the variation of a polar coordinate signal. To be specific, according to the technique described in U.S. Pat. No. 4,972,440, although the conversion of amplitude information and phase information is executed using a ROM (Read Only Memory), the increase of power consumption with high-speed sampling frequency processing is a problem that cannot be disregarded. In addition, when the phase information is outputted as a high IF (Intermediate Frequency) or RF (Radio Frequency), a higher sampling frequency is required, so power consumption significantly increases, creating a problem.

Also, when the frequency conversion is executed using complex processing by the digital signal processing as shown in FIG. 9, four multipliers are necessary to execute multiplication of a real-axis signal by a real-axis signal, an imaginary-axis signal by an imaginary-axis signal, a real-axis signal by an imaginary-axis signal, and an imaginary-axis signal by a real-axis signal. In addition, an adder or a subtractor is necessary to sum output values of the multipliers increasing circuit size and power consumption. Furthermore, the high power efficiency of the EER scheme deteriorates.

SUMMARY OF THE INVENTION

Accordingly, the present invention has been made to solve the above-mentioned problems occurring in the prior art. It is, therefore, an object of the present invention to provide a digital frequency converter with reduced size and power consumption even when using a digital signal processing in a portion of signal processing according to an EER (Envelope Elimination and Restoration) scheme.

The present invention provides a digital frequency converter capable of maintaining a high power efficiency of the EER scheme even though a digital signal processing is applied to a portion of processing using the EER scheme. To this end, according to an embodiment of the present invention, an inputted modulated signal is converted into phase information and amplitude information of a polar coordinate type by a phase detector 22 and an amplitude detector 23, The amplitude information is outputted as amplitude information of the digital frequency converter 2. Meanwhile, phase change of a frequency f2, which is outputted from an accumulator 27, corresponding to lower 'Q' figures, or bits, of phase data PD for frequency conversion is added to the phase information by an adder 24. In addition, a sampling frequency of the phase information outputted from the adder 24 is upsampled by an interpolator 28, and also, phase change of a frequency f3, which is outputted from an accumulator 30, corresponding to upper 'P-Q' figures, or bits, of the phase data PD for frequency conversion is added by the adder 29 to the phase information having undergone upsampling, is converted into a phase-modulated signal of an orthogonal coordinate type, and then outputted as phase information of the digital frequency converter 2.

To accomplish this object, in accordance with a first aspect of the present invention, there is provided a digital frequency converter for outputting phase information and amplitude information, the digital frequency converter including: a modulated-signal conversion means (e.g., a phase detector 22 and an amplitude detector 23 in an embodiment described later) for converting an inputted modulated signal into phase-information and amplitude information of a polar coordinate type; a sampling frequency conversion means (e.g., an interpolator 28 in an embodiment described later) for converting a sampling frequency of the phase information outputted from the modulated-signal conversion means; and a phase-modulated signal generation means (e.g., a wrap circuit 31, a COS_ROM 32, and a SIN_ROM 33 in an embodiment described later) for generating a phase-modulated signal on the basis of the phase information outputted from the sampling frequency conversion means.

According to the digital frequency converter having the above-mentioned construction, an inputted modulated signal is converted into phase information and amplitude information of a polar coordinate type by the modulated-signal conversion means, a sampling frequency of the phase information of the polar coordinate type is converted by the sampling frequency conversion means, and then the phase information of the polar coordinate type is converted into a phase-modulated signal by the phase-modulated signal generation means. Therefore, when conversion of a sampling frequency for the phase information of an inputted modulated signal is executed, the conversion of the sampling frequency can be easily achieved through at least one-half processing, as compared to the conversion of a sampling frequency for a phase-modulated signal of an orthogonal coordinate type.

In accordance with a second aspect of the present invention, there is provided a digital frequency converter for outputting phase information and amplitude information, the digital frequency converter including: a modulated-signal conversion means (e.g., a phase detector 22 and an amplitude detector 23 in an embodiment described later) for converting an inputted modulated signal into phase information and amplitude information of a polar coordinate type; a phase calculation means (e.g., an accumulator 27 in an embodiment described later) for accumulating and adding phase data according to a desired conversion frequency; a phase conversion means (e.g., an adder 24 in an embodiment described later) for adding/subtracting an output signal of the phase calculation means to/from the phase information outputted from the modulated-signal conversion means, thereby generating phase information to be obtained when frequency conversion for the modulated signal is executed; a sampling frequency conversion means (e.g., an interpolator 28 in an embodiment described later) for converting a sampling frequency of the phase information outputted from the phase conversion means; and a phase-modulated signal generation means (e.g., a wrap circuit 31, a COS_ROM 32, and a SIN_ROM 33 in an embodiment described later) for generating a phase-modulated signal on the basis of the phase information outputted from the sampling frequency conversion means.

According to the digital frequency converter having the above-mentioned construction, an inputted modulated signal is converted into phase information and amplitude information of a polar coordinate type by the modulated-signal conversion means, and simultaneously an accumulated/added value of the phase data according to a desired conversion frequency outputted from the phase calculation means is added/subtracted to/from the converted phase information by the phase conversion means. Therefore, frequency conversion for the phase information of an inputted modulated signal can be easily achieved using only simple adders/subtractors, without using any multiplier required when frequency conversion for a phase-modulated signal of the orthogonal coordinate type.

In addition, a sampling frequency of the phase information of the polar coordinate type is converted by the sampling frequency conversion means, and then the phase information of the polar coordinate type is converted into a phase-modulated signal by the phase-modulated signal generation means. Therefore, when conversion of a sampling frequency for the phase information of an inputted modulated signal is executed, the conversion of the sampling frequency can be easily achieved through at least one-half processing, as compared to the conversion of a sampling frequency for a phase-modulated signal of an orthogonal coordinate type. In addition, since frequency conversion for the phase information is executed by the phase conversion means before conversion of a sampling frequency, the frequency conversion for the phase information can be executed, without allowing an operational frequency of the phase conversion means to become unnecessarily high, within a range capable of preventing occurrence of aliasing.

In accordance with a third aspect of the present invention, there is provided a digital frequency converter for outputting phase information and amplitude information, the digital frequency converter including: a modulated-signal conversion means (e.g., a phase detector 22 and an amplitude detector 23 in an embodiment described later) for converting an inputted modulated signal into phase information and amplitude information of a polar coordinate type; a phase calculation means (e.g., an accumulator 30 in an embodiment described later) for accumulating and adding phase data according to a desired conversion frequency; a sampling frequency conversion means (e.g., an interpolator 28 in an embodiment described later) for converting a sampling frequency of the phase information outputted from the modulated-signal conversion means; a phase conversion means (e.g., an adder 29 in an embodiment described later) for adding/subtracting an output signal of the phase calculation means to/from the phase information outputted from the sampling frequency conversion means, thereby generating phase information to be obtained when frequency conversion for the modulated signal is executed; and a phase-modulated signal generation means (e.g., a wrap circuit 31, a COS_ROM 32, and a SIN_ROM 33 in an embodiment described later) for generating a phase-modulated signal on the basis of the phase information outputted from the phase conversion means.

According to the digital frequency converter having the above-mentioned construction, an inputted modulated signal is converted into phase information and amplitude information of a polar coordinate type by the modulated-signal conversion means, and simultaneously a sampling frequency of the phase information of the polar coordinate type is converted by the sampling frequency conversion means. Therefore, when conversion of a sampling frequency for the phase information of an inputted modulated signal is executed, the conversion of the sampling frequency can be easily achieved through at least one-half processing, as compared to the conversion of a sampling frequency for a phase-modulated signal of an orthogonal coordinate type. In addition, since an accumulated/added value of the phase data according to a desired conversion frequency outputted from the phase calculation means is added/subtracted to/from the phase information outputted from the sampling frequency conversion means, frequency conversion for the phase information of an inputted modulated signal can be easily achieved using only simple adders/subtractors, without using any multiplier required when frequency conversion for a phase-modulated signal of the orthogonal coordinate type.

In accordance with a fourth aspect of the present invention, there is provided a digital frequency converter for outputting phase information and amplitude information, the digital frequency converter including: a modulated-signal conversion means (e.g., a phase detector 22 and an amplitude detector 23 in an embodiment described later) for converting an inputted modulated signal into phase information and amplitude information of a polar coordinate type; a first phase calculation means (e.g., an accumulator 27 in an embodiment described later) for accumulating and adding phase data of lower 'Q' figures (Q is a positive integer) from among phase data of 'P' figures (P is a positive integer) according to a desired conversion frequency; a second phase calculation means (e.g., an accumulator 30 in an embodiment described later) for accumulating and adding phase data of upper 'P-Q' figures from among the phase data of 'P' figures according to a desired conversion frequency; a first phase conversion means (e.g., an adder 24 in an embodiment described later) for adding/subtracting an output signal of the first phase calculation means to/from the phase information outputted from the modulated-signal conversion means, thereby generating phase information to be obtained when frequency conversion for the modulated signal is executed on the basis of the phase data of the lower 'Q' figures; a sampling frequency conversion means (e.g., an interpolator 28 in an embodiment described later) for converting a sampling frequency of the phase information outputted from the first phase conversion means; a second phase conversion means (e.g., an adder; 29 in an embodiment described later) for adding/subtracting an output signal of the second phase calculation means to/from phase information outputted from the sampling frequency conversion means, thereby generating phase information to be obtained when frequency conversion for the modulated signal is executed on the basis of the phase data of the 'P' figures; and a phase-modulated signal generation means (e.g., a wrap circuit 31, a COS_ROM 32, and a SIN_ROM 33 in an embodiment described later) for generating a phase-modulated signal on the basis of the phase information outputted from the second phase conversion means.

According to the digital frequency converter having the above-mentioned construction, an inputted modulated signal is converted into phase information and amplitude information of a polar coordinate type by the modulated-signal conversion means, phase data of lower 'Q' figures (Q is a positive integer) from among phase data of 'P' figures (P is a positive integer) according to a desired conversion frequency are accumulated and added by the first phase calculation means, and the phase data accumulated and added by the first phase calculation means are added/subtracted to/from the phase information by the first phase conversion means. Therefore, frequency conversion is executed for the phase data of the lower 'Q' figures (i.e., lower than the desired conversion frequency) from among phase data of 'P' figures. In addition, a sampling frequency of an output signal of the first phase conversion means is upsampled by the sampling frequency conversion means, phase data of upper 'P-Q' figures from among the phase data of the 'P' figures according to the desired conversion frequency are accumulated and added, and the accumulated and added phase data are added/subtracted to/from the upsampled signal by the second phase conversion means. As a result, frequency conversion of the desired conversion frequency is executed with respect to phase data of the upper 'P-Q' figures from among the phase data of the 'P' figures, which is not converted by the first phase conversion means, and frequency conversion for the modulated signal on the basis of the phase data of the 'P' figures.

According to the above-mentioned construction, when frequency conversion and sampling frequency conversion for the phase information of an inputted modulated signal are executed through two divided steps, a conversion frequency for the phase information used by the first phase conversion means is lower than the desired conversion frequency. Therefore, when a sampling frequency of an output signal of the first phase conversion means is set to be a low value on the basis of the conversion frequency by the first phase conversion means, it is possible to set operational frequency of the modulated signal conversion means, the first phase calculation means, or the first phase conversion means to be a low value on the basis of the sampling frequency of the output signal of the first phase conversion means.

In accordance with a fifth aspect of the present invention, the second phase conversion means adds/subtracts the output signal of the second phase calculation means to/from a signal of upper 'P-Q' figures from among an output signal of the sampling frequency conversion means.

According to the digital frequency converter having the above-mentioned construction, the second phase conversion means adds/subtracts the output signal of the second phase calculation means to/from a signal of upper 'P-Q' figures from among an output signal of the sampling frequency conversion means, so that it is possible to reduce the length of operation language of the adder for a signal obtained after conversion of a sampling frequency, which perforce must increase when frequency conversion and sampling frequency conversion are executed for the phase information of an inputted modulated signal.

In accordance with a sixth aspect of the present invention, any one of the above-mentioned digital frequency converters further includes an input sampling frequency conversion means (e.g., an interpolator 21 in an embodiment described later) for converting a sampling frequency of the inputted modulated signal, wherein the digital frequency converter converts the sampling frequency of the modulated signal and then converts the modulated signal into the phase information and the amplitude information of the polar coordinate type.

According to the digital frequency converter having the above-mentioned construction, the digital frequency converter performs upsampling for an inputted modulated signal by the input sampling frequency conversion means and then converts the modulated signal into the phase information and the amplitude information of the polar coordinate type. Therefore, when the inputted modulated signal is converted into the phase and amplitude information of the polar coordinate type, although the converted phase and amplitude information of the polar coordinate type outputted from the modulated signal conversion means have a wider frequency bandwidth than that of the inputted modulated signal, it is possible to prevent aliasing from occurring in phase and amplitude information of the polar coordinate type.

With the digital frequency converter according to the first aspect of the present invention, when conversion of a sampling frequency for the phase information of an inputted modulated signal is executed, the conversion of the sampling frequency can be easily achieved through at least one-half processing, as compared to the conversion of a sampling frequency for a phase-modulated signal of an orthogonal coordinate type.

As a result of reducing the processing amount for conversion of a sampling frequency, the amount of operation required for conversion of the sampling frequency with respect to an inputted modulated signal is reduced, thereby having an advantage in that power consumption can be reduced while the size of circuit for the digital frequency converter is reduced.

With the digital frequency converter according to the second and third aspects of the present invention, frequency conversion for the phase information of an inputted modulated signal can be easily achieved using only simple adders/subtractors, without using any multiplier, which is usually required for frequency conversion of a phase-modulated signal of an orthogonal coordinate type. In addition, when conversion of a sampling frequency for the phase information of an inputted modulated signal is executed, the conversion of the sampling frequency can be easily achieved through at least one-half processing, as compared to the conversion of a sampling frequency for a phase-modulated signal of an orthogonal coordinate type. Particularly, with the digital frequency converter according to the second aspect of the present invention, since frequency conversion for the phase information is executed by the phase conversion means before conversion of a sampling frequency, the frequency conversion for the phase information can be executed, without allowing an operational frequency of the phase conversion means to become unnecessarily high, within a range capable of preventing occurrence of aliasing.

As a result of such construction by which the execution of frequency conversion for phase information does not require any multiplier, the amount of operation required for the frequency conversion is reduced, so that it has the advantage of reducing power consumption while the size of circuit for the digital frequency converter is reduced. In addition, since it is possible to lower operational frequency and complexity for processing frequency conversion of the phase information, the size of circuit for the digital frequency converter can be further reduced, thereby further reducing power consumption.

With the digital frequency converter according to the fourth aspect of the present invention, when frequency conversion and sampling frequency conversion for an inputted modulated signal are executed, it is possible to set operational frequencies of the first phase calculation means and the first phase conversion means to be a value as small as possible according to the sampling frequency of an output signal.

Therefore, as a result of such construction by which a portion of processing can be executed with a reduced operational frequency, it has the advantage of reducing power consumption while the size of circuit for the digital frequency converter is reduced.

With the digital frequency converter according to the fifth aspect of the present invention, it is possible to reduce the length of operation language of the adder for a signal obtained after conversion of a sampling frequency, which perforce must increase when frequency conversion and sampling frequency conversion are executed for the phase information of an inputted modulated signal.

Therefore, as a result of such construction by which frequency conversion and sampling frequency conversion can be executed with a reduced length of operation language (even if it is only a portion of processing) in an operator, it has the advantage of reducing power consumption while the size of circuit for the digital frequency converter is reduced.

With the digital frequency converter according to the sixth aspect of the present invention, although the converted phase and amplitude information of the polar coordinate type have a wider frequency bandwidth than that of the inputted modulated signal, it is possible to prevent aliasing from occurring in phase and amplitude information of the polar coordinate type.

Therefore, the digital frequency converter according to the present invention can reduce output degradation in such characteristic as conversion error, noise, etc. even when the converter has a reduced circuit size and reduced power consumption.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENT

Hereinafter, a preferred embodiment of the present invention will be described with reference to the accompanying drawings. In the following description of the present invention, a detailed description of known functions and configurations incorporated herein will be omitted when it may obscure the subject matter of the present invention.

Construction of Transmitter

Figure 1:
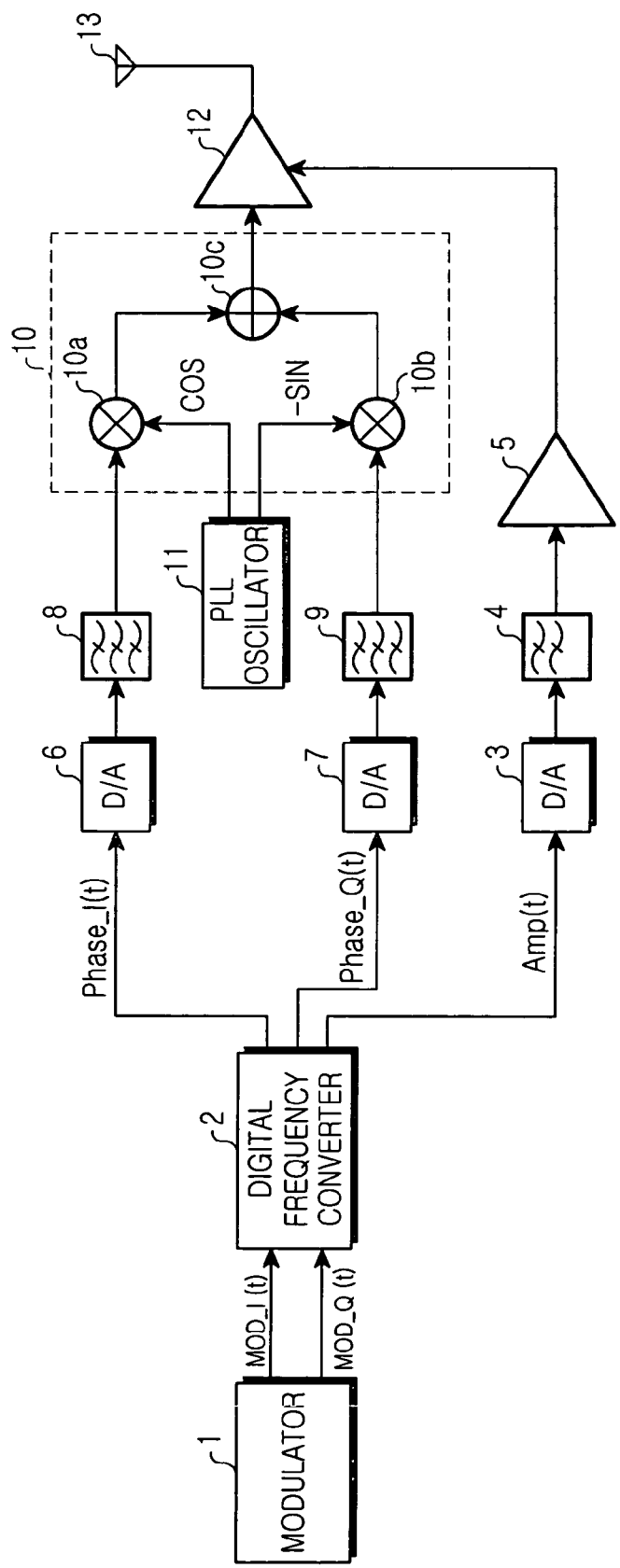
FIG. 1 is a block diagram illustrating a construction of a transmitter of an EER (Envelope Elimination and Restoration) scheme which contains a digital frequency converter according to an embodiment of the present invention.

FIG. 1 is a block diagram illustrating a construction of a transmitter containing a digital frequency converter, which employs an EER (Envelope Elimination and Restoration) scheme, according to an embodiment of the present invention.

Figure 2:
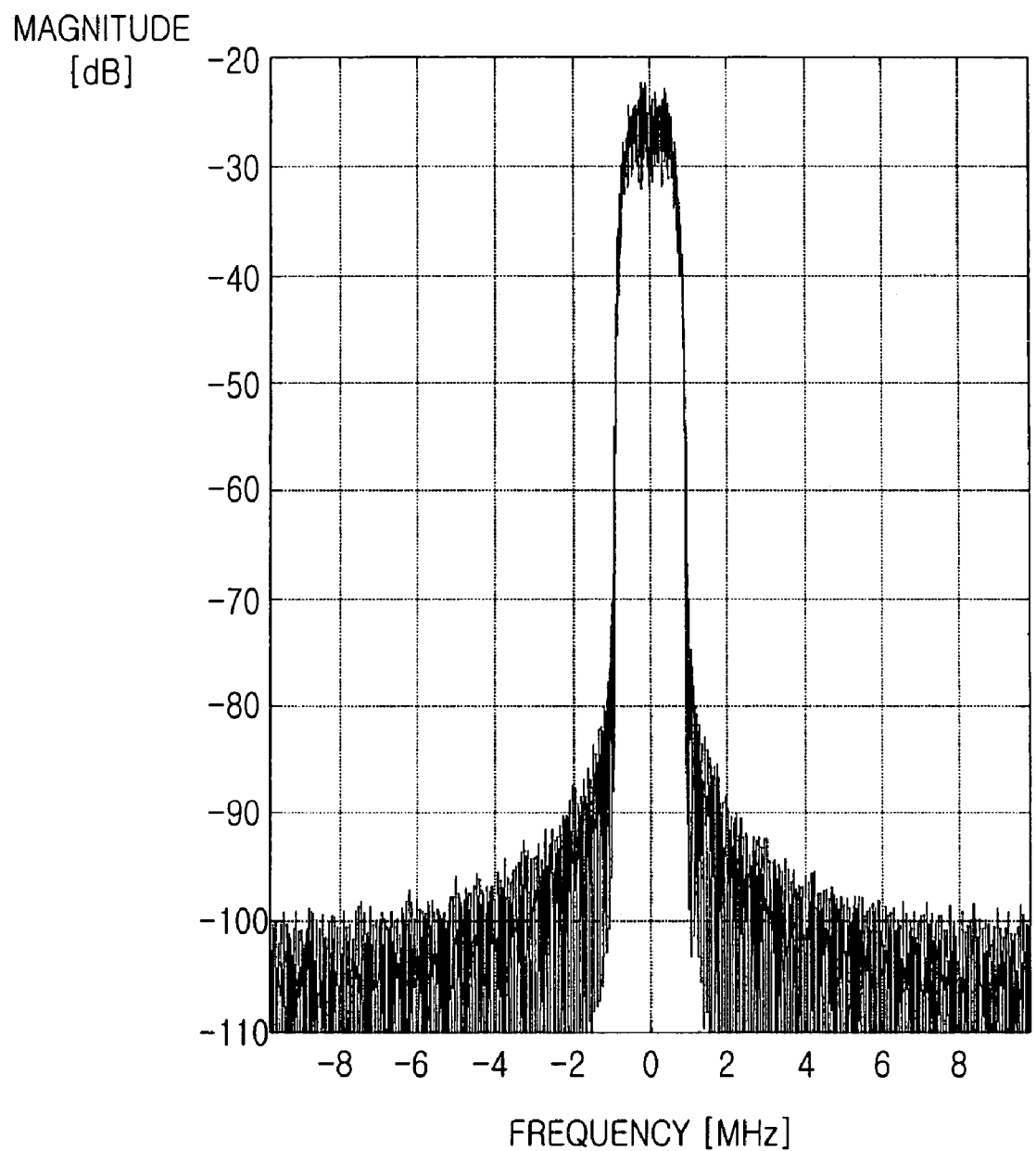
FIG. 2 is a graph illustrating the spectrum of a π/4-shift QPSK signal inputted to the digital frequency converter shown in FIG. 1, which is expressed using eight-time sampling.

A modulator 1 generates a signal such as a π/4-shift QPSK signal shown in FIG. 2. Modulated signals MOD_I(t) and MOD_Q(t) having a quantized state, which are outputted from the modulator 1, are inputted to a digital frequency converter 2. In the digital frequency converter 2, frequency conversion with respect to the modulated signals MOD_I(t) and MOD_Q(t) is done on a desired IF signal. The modulated signals MOD_I(t) and MOD_Q(t) are separated into amplitude information Amp(t) and phase-modulated signals Phase_I(t) and Phase_Q(t) of the orthogonal coordinate type. FIG. 2 is a graph illustrating the spectrum of modulated signals MOD_I(t) and MOD_Q(t) (π/4-shift QPSK signal)), which is expressed using eight-time sampling, with the transverse axis representing frequencies [MHz] and the longitudinal axis representing magnitude [dB].

The amplitude information Amp(t) is converted into an analog signal by a D/A converter 3, and then is frequency band limited by an LC low-pass filter 4 including a coil and a condenser (not shown). Then, a signal outputted from the LC low-pass filter 4 is amplified by a linear power amplifier 5 having a linear input-output characteristic, to generate output signal amplitude information.

Meanwhile, the phase-modulated signals Phase_I(t) and Phase_Q(t) are converted into analog signals by D/A converters 6 and 7, and then are frequency band limited by LC low-pass filter 8 and 9, respectively, wherein each of the LC low-pass filters 8 and 9 include a coil and a condenser. Then, signals output from the LC low-pass filters 8 and 9 are quadrature-modulated by a cosine wave and a negative sine wave having a phase preceding that of the cosine wave by 90 degrees through a quadrature modulator 10, which contains mixers 10A and 10B and an adder 10C. As a result, the signals outputted from the LC low-pass filters 8 and 9 are converted into a phase-modulated signal of a transmission frequency (RF frequency) represented as a real-axis signal. The phase-modulated signal is then input to a nonlinear power amplifier 12 having nonlinear input-output characteristics.

Through the nonlinear power amplifier 12, the phase-modulated signal of a transmission frequency which is represented as a real-axis signal is amplitude-modulated on the basis of the amplitude information for an output signal of the transmitter which is outputted from the linear power amplifier 5, thereby generating a transmission signal to be transmitted through an antenna 13.

Construction of Digital Frequency Converter

Figure 3:
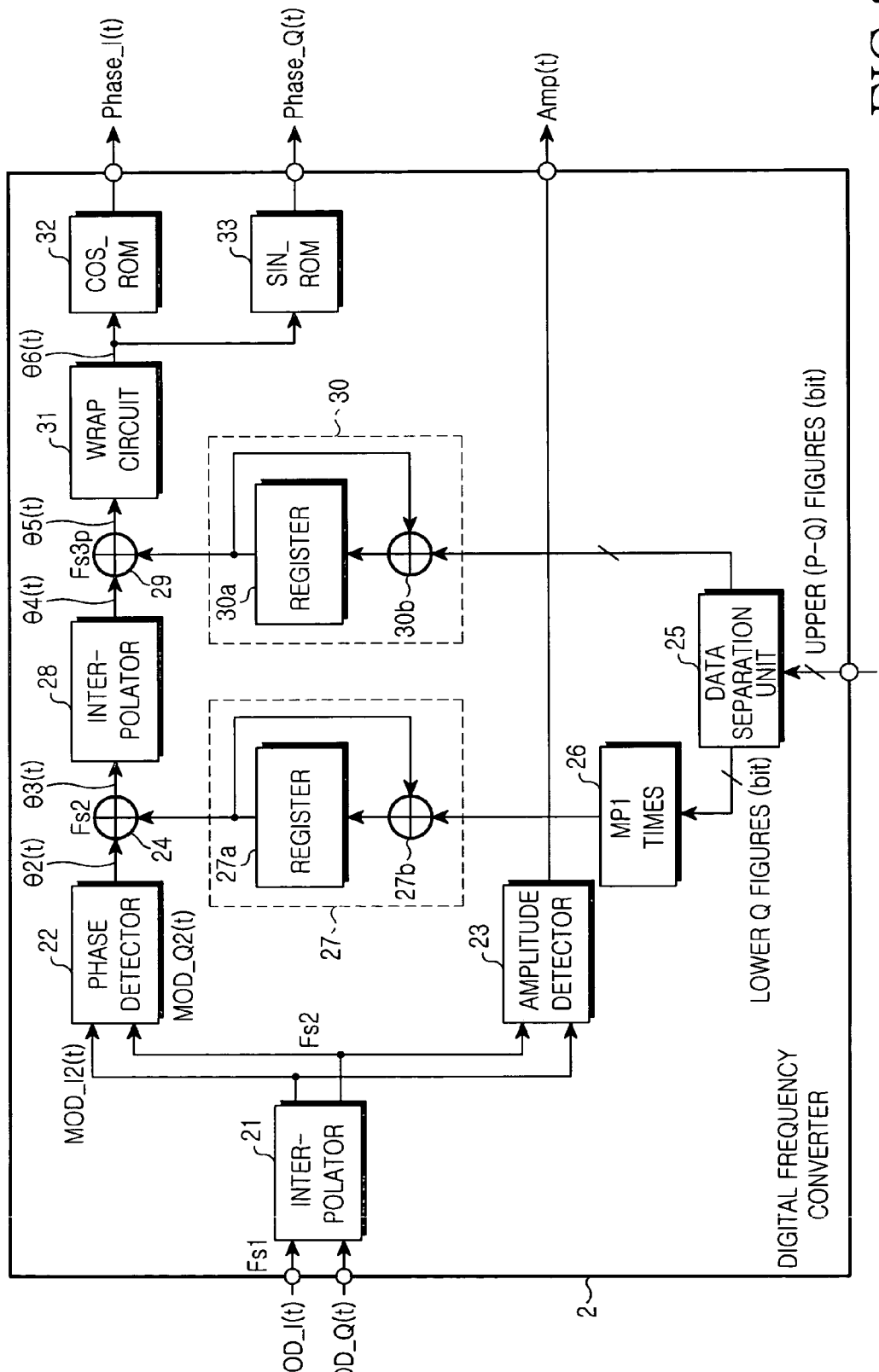
FIG. 3 is a block diagram illustrating a detailed construction of the digital frequency converter shown in FIG. 1.

Next, a construction of the digital frequency converter 2 will be described in detail. FIG. 3 is a block diagram illustrating a detailed construction of the digital frequency converter 2 according to an embodiment of the present invention. The following example assumes a case where conversion of a desired conversion frequency f1 and upsampling of a sampling frequency are executed between input and output terminals of the digital frequency converter 2 with respect to the phase information of an inputted modulated signal.

Modulated signals MOD_I(t) and MOD_Q(t) of a sampling frequency 'Fs2' (Fs2=Fs1×MC1), which undergoes 'MC1=2' time sampling by a symbol rate of 'Fs1' and are output from the modulator 1, and converted into modulated signals MOD_I2(t) and MOD_Q2(t) of a sampling frequency 'Fs3' (Fs3=Fs2×MC2) by an interpolator 21 which performs 'MC2' time upsampling with respect to a sampling frequency of a signal, and then input to a phase detector 22 and an amplitude detector 23.

MC2-time upsampling is used because when phase information and amplitude information are detected in the phase detector 22 and the amplitude detector 23, the detected phase information and amplitude information have wider bandwidths than those of input signals causing aliasing in the detected phase information and amplitude information.

Figure 4:
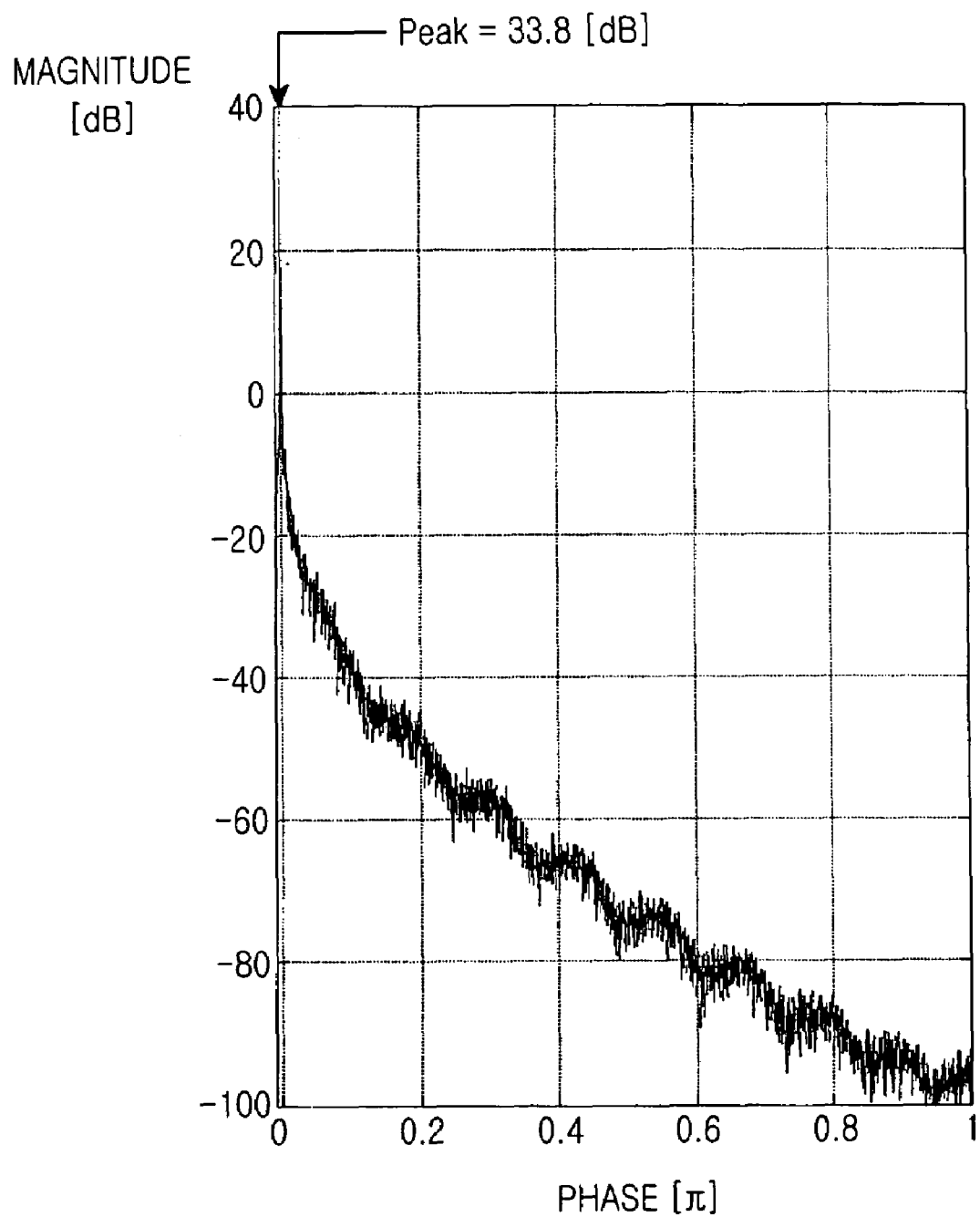
FIG. 4 is a graph illustrating the spectrum of phase information θ1(t), which is expressed using 16-time sampling.

Meanwhile, in the phase detector 22, an arctangent value of a vector formed by a real-axis signal and an imaginary-axis signal of the modulated signals MOD_I2(t) and MOD_Q2(t) on a complex plane is calculated according to Equation 1 below, to obtain phase information θ1(t). FIG. 4 is a graph illustrating the spectrum of phase information θ1(t), expressed using 16-time sampling, with the transverse axis representing phase [π] and the longitudinal axis representing magnitude [dB]. Referring to the spectrum of the phase information θ1(t), at ¼ portion of sampling frequency (i.e., around 0.5 π of phase), the spectrum is attenuated but a signal component exists. When a sampling frequency is low, a signal of an unnecessary frequency band may not be sufficiently filtered, or signal distortion may be caused due to aliasing.

Since the phase information θ1(t) calculated using Equation 1 is discontinuous phase information represented in an angle range of 0 to 2 π, the phase detector 22 performs unwrapping with respect to the phase information θ1(t), thereby converting the phase information θ1(t) into continuous phase information θ2(t). In this case, a quantization bit number in the phase detector 22 is determined as a function of the kind and the contents of the input modulated signal so that the phase information θ2(t) may not become discontinuous due to the quantization bit number in the phase detector 22.

$$\theta1(t)=\tan^{-1}\{MOD\_Q2(t)/MOD\_I2(t)\} \quad \text{Equation 1}$$

Figure 5:
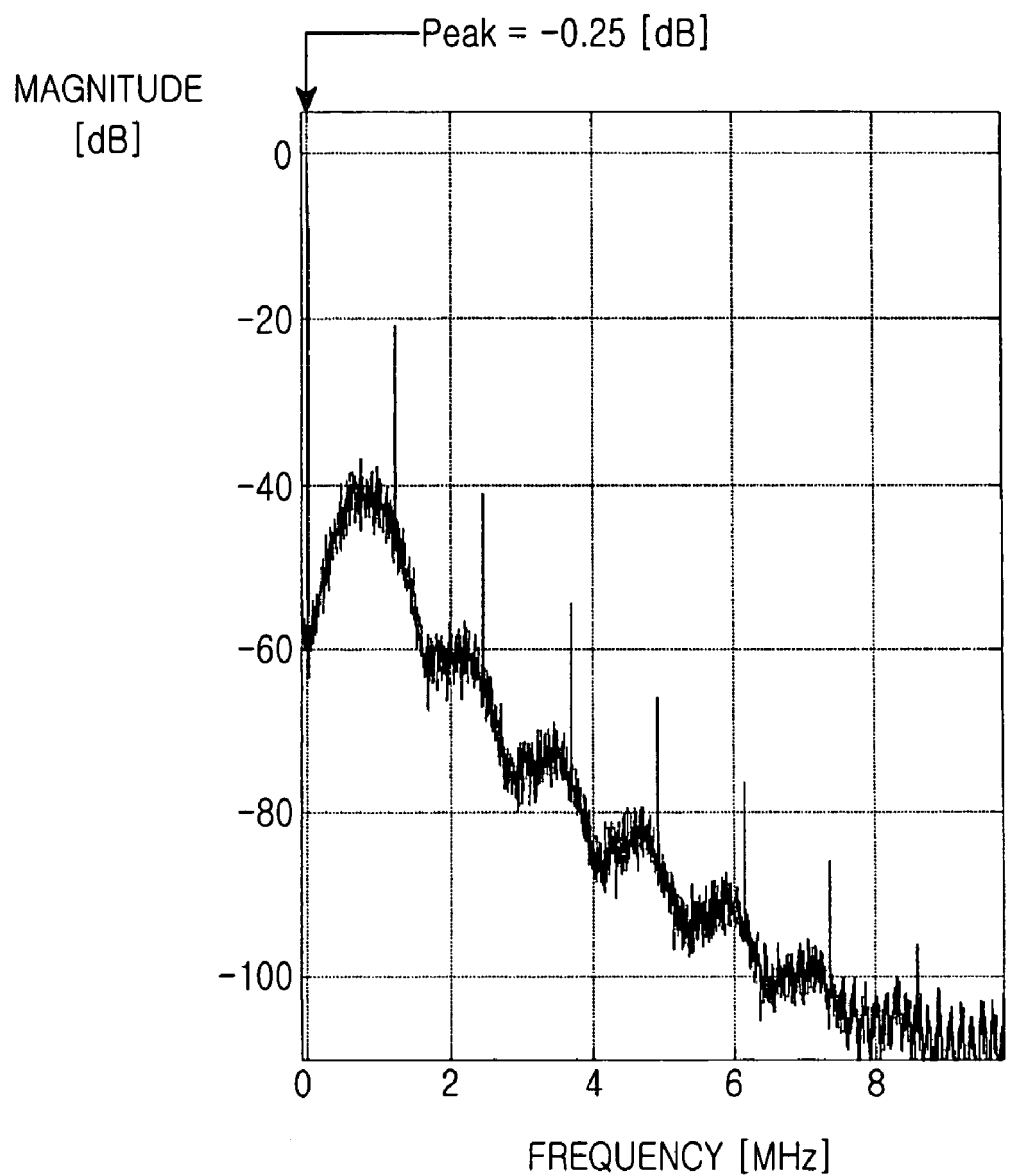
FIG. 5 is a graph illustrating the spectrum of amplitude information Amp(t)), which is expressed using 16-time sampling.

In the amplitude detector 23, using Equation 2 below, the real-axis signal and the imaginary signal of the modulated signals MOD_I2(t) and MOD_Q2(t) are squared and added to each other. The square root of the sum is used to calculate amplitude information Amp(t). The calculated amplitude information Amp(t), which is amplitude information output from the digital frequency converter 2, is input to the D/A converter 3 of the above-mentioned transmitter. The amplitude information Amp(t) may be output after change of a sampling frequency. FIG. 5 is a graph illustrating the spectrum of amplitude information Amp(t), which is expressed using 16-time sampling, with the transverse axis representing frequency [MHz] and the longitudinal axis representing magnitude [dB]. In the amplitude information Amp(t) similar to the phase information θ1(t), when a sampling frequency is low, a signal of a unnecessary frequency band may not be sufficiently filtered, or signal distortion may be caused by aliasing.

$$\text{Amp}(t)=\sqrt{MOD\_I2(t)^2+MOD\_Q2(t)^2} \quad \text{Equation 2}$$

Meanwhile, phase information θ2(t) calculated by the phase detector 22 is input to an adder 24 and thus is phase-converted on the basis of phase data PD for frequency conversion according to the desired conversion frequency f1. As a result, the frequency conversion by the desired conversion frequency f1 is executed with respect to modulated signals MOD_I2(t) and MOD_Q2(t) of a sampling frequency 'Fs2' in such a manner that phase conversion is endowed (addition/subtraction) to the phase information θ2(t).

To be specific, the phase data (PD) for frequency conversion includes a phase change width obtained by quantifying the phase change of a signal according to the desired conversion frequency f1 for the sampling data of the signal output from the digital frequency converter 2. That is, the phase data PD for frequency conversion is obtained by sampling each frequency '2 πf1' according to the desired conversion frequency f1 with a sampling frequency 'Fs3p' of the signal output from the digital frequency converter 2. In addition, the phase data (PD) for frequency conversion is expressed as a number being a power of 2.

The frequency conversion according to desired conversion frequency f1 is realized by subdivided frequency conversion steps, that is, by two frequency conversion steps, that includes a first frequency conversion by a conversion frequency f2 (conversion frequency f2<conversion frequency f1) capable of being set, and a second frequency conversion by a remaining conversion frequency f3 (conversion frequency f3=conversion frequency f1−conversion frequency f2).

That is, a signal frequency-converted by the desired conversion frequency f1 should have a high sampling frequency corresponding to the conversion frequency f1. But, a signal frequency-converted by the desired conversion frequency f2 may have a lower frequency than that of the signal frequency-converted by the conversion frequency f1. Executing the frequency conversion in two steps lowers the sampling frequency, thereby reducing circuit size and power consumption.

Therefore, in the adder 24, the phase change for frequency conversion by the conversion frequency f2 is converted, preferably by an angular rate conversion. In addition, the sampling frequency Fs2 of a signal output from the adder 24 is '1/MP1' times as large as the sampling frequency Fs3$p$ of a signal outputted from the digital frequency converter 2.

Therefore, when the phase data (PD) for frequency conversion of 'P' bits (P is a positive integer) according to the desired conversion frequency f1 are calculated on the basis of the sampling frequency Fs3$p$ of a signal outputted from the digital frequency converter 2, a value obtained by multiplying phase data of lower 'Q' figures [bit] (Q is a positive integer) from among the phase data PD for frequency conversion by 'MP1' is determined to be a phase change width every one sampling for a signal outputted from the phase detector 22. The phase change width is a delta value for the signal change in each sampling period.

To be specific, phase data of lower 'Q' figures [bit] are separated from the phase data PD for frequency conversion in a data separation unit 25, and the phase data of lower 'Q' figures [bit] are multiplied by 'MP1' in a data amplification unit 26. Then, the phase data multiplied by 'MP1' is accumulated and added in an accumulator 27, which contains a register 27A and an adder 27B operating at a sampling frequency Fs2, so that it is possible to calculate phase change for frequency conversion; by which a frequency can be set in the frequency step of conversion frequency 'f1/$2^P$' (i.e., conversion of frequency f2 corresponding to lower 'Q' figures [bit] from among the phase data PD for frequency conversion).

In the adder 24 operating in the sampling frequency Fs2, the phase change calculated in the conversion of frequency f2 is added to the phase information θ2(t) output from the phase detector 22 for each sample data to generate phase information θ3(t).

Therefore, the phase information of a signal generated can be obtained as the phase information θ3(t) output from the adder 24 when the frequency of the modulated signals MOD_I2(t) and MOD_Q2(t) increases by the conversion frequency f2. Also, the phase information of a signal to be generated in the case of decreasing the frequency of the modulated signals MOD_I2(t) and MOD_Q2(t) can be obtained by replacing the adder 24 with a subtractor and by subtracting phase change data output from the accumulator 27 from the phase information θ2(t) calculated in the phase detector 22.

Next, the phase information θ3(t) output from the adder 24 is converted into phase information θ4(t) of a sampling frequency Fs3$p$ (Fs3$p$=Fs2×MP1) by interpolator 28, which performs an 'MP1' time upsampling a sampling frequency of the phase information θ3(t). The resulting upsampled signal is then input to an adder 29.

The adder 29 converts f3 as a function of the information received from the interpolator 28.

The width can be replaced with a delta. That is, the phase data of upper 'P-Q' figures [bit] from among the phase data (PD) for frequency conversion of 'P' figures [bit] according to the desired conversion frequency f1 are determined to be a phase change of a width corresponds to each sampling for a signal outputted from the interpolator 28. The phase data of upper 'P-Q' figures [bit] are separated from the phase data PD for frequency conversion in the data separation unit 25.

The phase data separated by the data separation unit 25 is accumulated and added in an accumulator 30 which contains a register 30A and an adder 30B operating on a sampling frequency Fs3$p$. In this way, it is possible to calculate phase change for frequency conversion by which a frequency can be set in the frequency step of conversion frequency 'f1/$2^{P-Q}$' (i.e., frequency conversion of the conversion frequency 13 corresponding to upper 'P-Q' figures [bit] from among the phase data (PD) for frequency conversion).

In the adder 29 operating in the sampling frequency Fs3$p$, the phase change calculated in corresponding frequency 13 is added to the phase information θ4(t) output from the interpolator 28 for each sampling, thereby generating phase information θ5(t). In addition, when the phase change in conversion of frequency f3 output from the accumulator 30 is a signal corresponding to a signal of upper 'P-Q' figures [bit] from among the phase information θ4(t) outputted from the interpolator 28, the adding operation of the adder 29 is performed to add the phase change of 'P-Q' figures [bit] outputted by the accumulator 30 to a signal of upper 'P-Q' figures [bit] from among the phase information θ4(t) outputted from the interpolator 28.

Therefore, the phase information of a generated converted signal can be obtained as the phase information θ5(t) output from the adder 29 when the frequency increased for the modulated signals MOD_I2(t) and MOD_Q2(t) increase by same amount as the conversion frequency f1 (f1=f2+f3). In addition, as described above, the phase information of a generated signal can be obtained by replacing the adder 24 with a subtractor and subtracting phase change data output by the accumulator 30 from the phase information θ4(t) calculated in the interpolator 28 when the frequency of the modulated signals MOD_I2(t) and MOD_Q2(t) decreases.

The phase information θ5(t) of a signal obtained by increasing the frequency of the modulated signals MOD_I2(t) and MOD_Q2(t) by the conversion frequency f1 (f1=f2+f3) undergoes a wrapping process by a wrap circuit 31 and is converted into discontinuous phase information θ6(t) represented in angles of 0 to 2π. Then, the phase information θ6(t) is inputted to a COS_ROM 32 and a SIN_ROM 33 each of which memorizes a COS {θ(t)} and a SIN {θ(t)} corresponding to phase information θ(t) represented in angles of 0 to 2π, thereby generating phase-modulated signals 'Phase_I(t)=COS{θ6(t)}' and 'Phase_Q(t)=SIN{θ6(t)}' of the orthogonal coordinate type.

The generated phase-modulated signals Phase_I(t) and Phase_Q(t), which are phase information to be output from the digital frequency converter 2, are input to the above-mentioned D/A converters 6 and 7 of the transmitter. If a different transmitter that does not use a complex signal is used, it is sufficient to output only the 'Phase_I(t)=COS {θ6(t)}' from among the phase-modulated signals of the orthogonal coordinate type.

Figure 6:
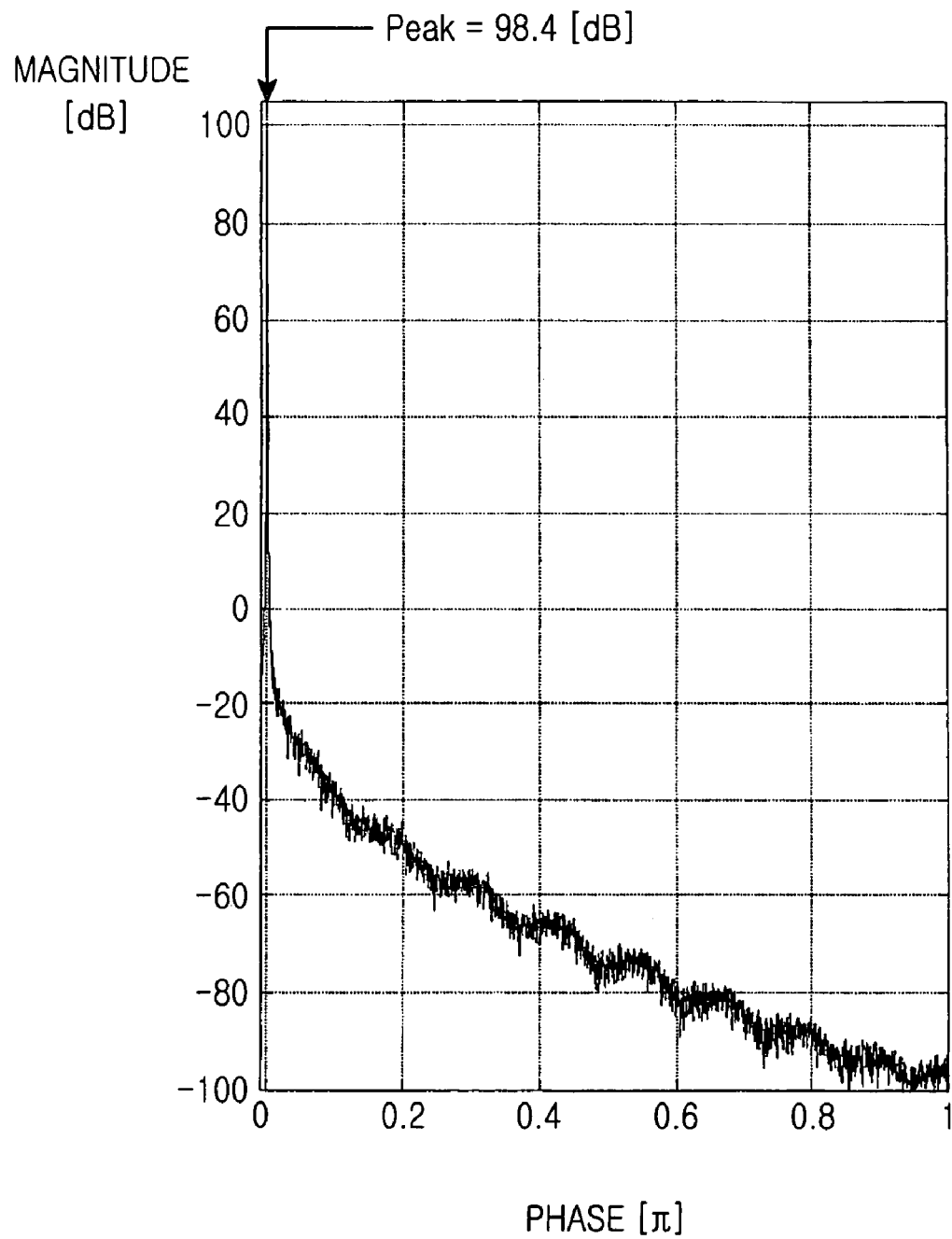
FIG. 6 is a graph illustrating the spectrum of phase information θ3(t) obtained after the phase information θ1(t) shown in FIG. 4 undergoes frequency conversion.

In addition, when fixed values are accumulated and added as in the accumulator 27, a high peak results around phase zero on a phase spectrum. The peak increase proportionally to the accumulated and added fixed values (i.e., the size of the phase data for frequency conversion). FIG. 6 is a graph illustrating the spectrum of phase information θ3(t) obtained after the phase information θ1(t) shown in FIG. 4 undergoes frequency conversion for a normalized frequency of 0.402662489 with a sampling frequency of one. The transverse axis represents phase [π] and the longitudinal axis represents magnitude [dB]. Unlike the spectrum shown in FIG. 4, the spectrum shown in FIG. 6 shows a high peak around phase zero.

A high peak shown in the spectrum increases the length of operation language required to perform sampling frequency conversion of the phase information θ3(t) in the interpolator 28, thereby increasing power consumption in the interpolator 28. Further, in the interpolator 28, the filter for limiting a signal of an unnecessary frequency band after upsampling should be capable of achieving a considerable amount attenuation of stop band. The filter should be a high-order filter which consumes increased power.

Therefore, it is necessary to limit the value of the conversion frequency f2 within a range where there is no increase of the spectrum peak caused by the phase processing for conversion of the frequency f2 by the adder 24 and the accumulator 27. The range of the conversion frequency f2 should also avoid large difference changes of operation language length and the filter order in the interpolator 28 between the time when phase is processed and when phase is not processed.

Also, in the above-mentioned embodiment, when a modulated signal which is not roll-off-filtered is input from the modulator 1 to the digital frequency converter 2, it is possible that a roll-off filter is installed at the following end of the interpolator 28 to perform waveform shaping for an input modulated signal and then phase information and amplitude information are detected in the phase detector 22 and the amplitude detector 23, respectively.

Figure 7:
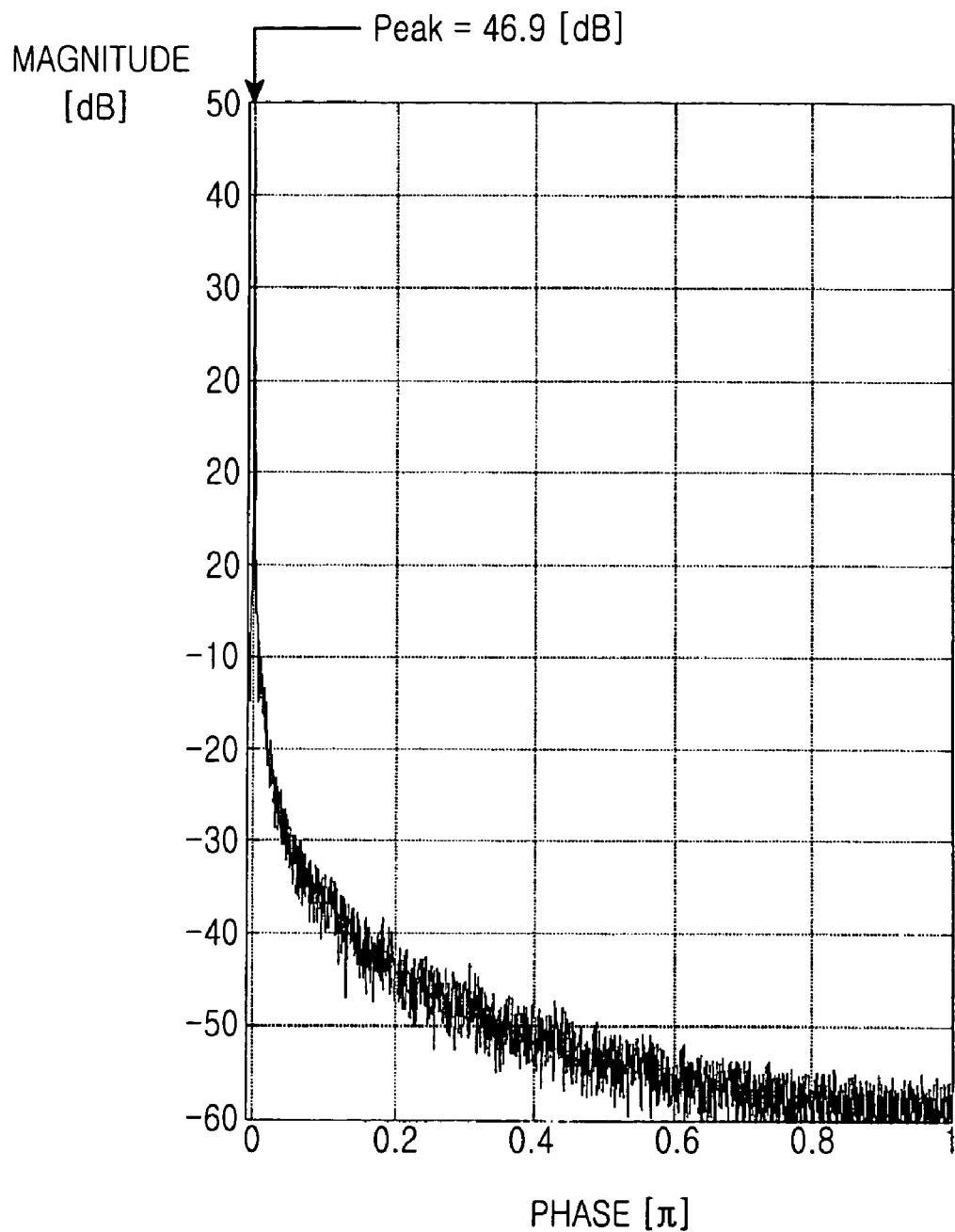
FIG. 7 is a graph illustrating the spectrum of phase information of a QPSK signal), which is expressed using 16-time sampling.
Figure 8:
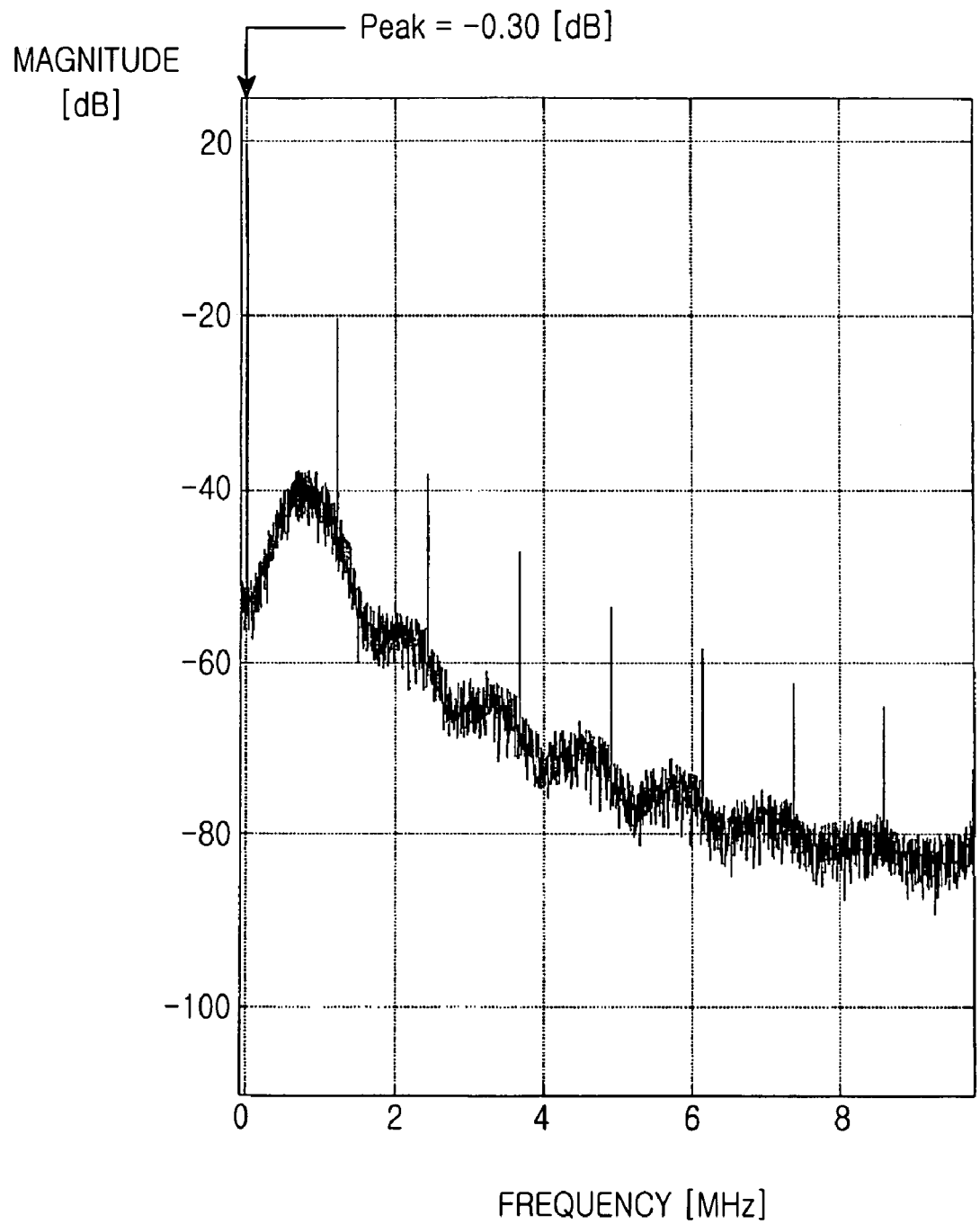
FIG. 8 is a graph illustrating the spectrum of amplitude information of a QPSK signal), which is expressed using 16-time sampling.
Figure 9:
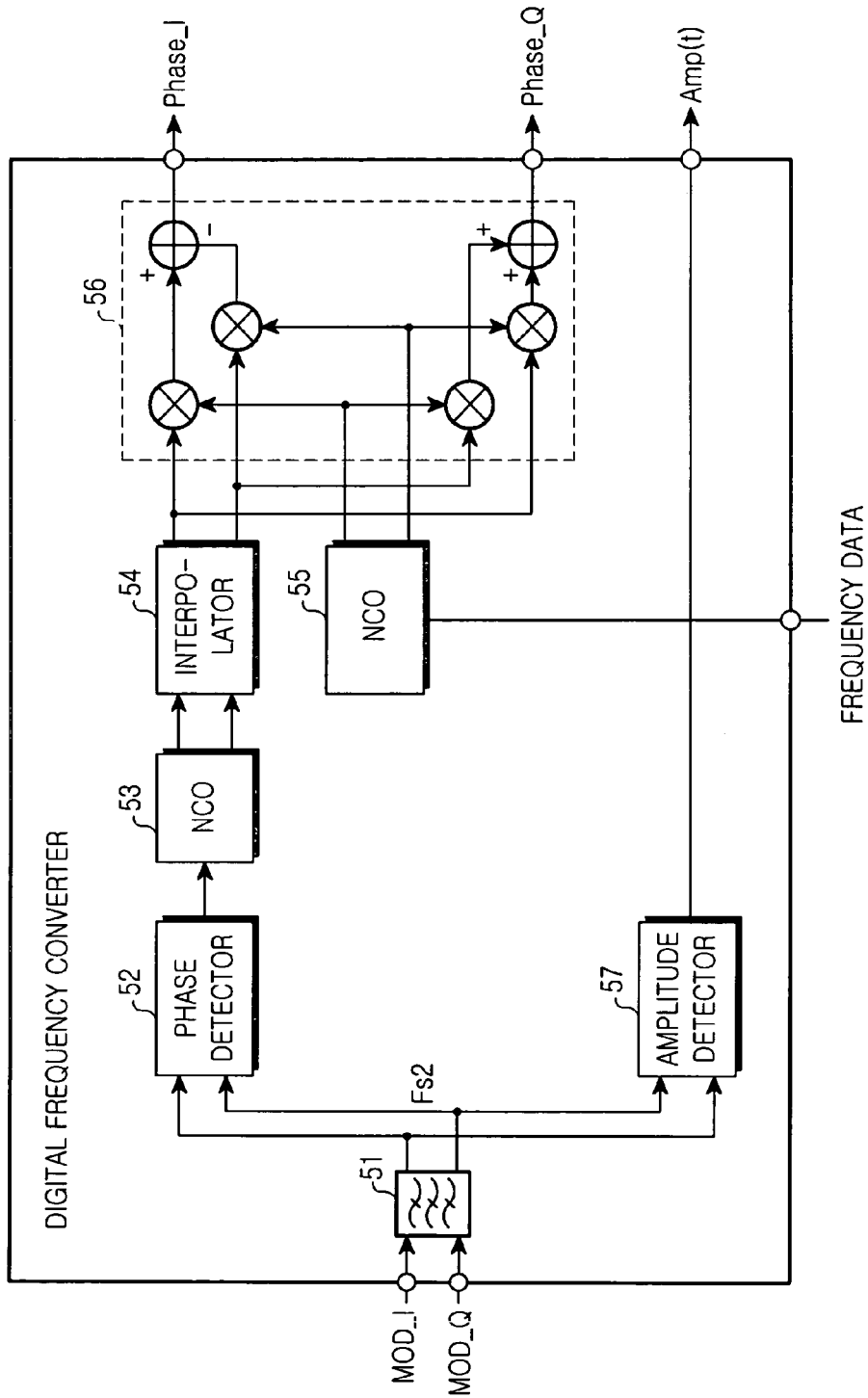
FIG. 9 is a block diagram illustrating a conventional digital frequency converter.

In addition, in the above-mentioned embodiment, when a QPSK signal is input from the modulator 1 to the digital frequency converter 2, it is necessary to endow a higher conversion rate of a sampling frequency for a π/4-shift QPSK signal in the interpolator 28 than that endowed when the π/4-shift QPSK signal is input. It is necessary to install a filter for limiting spuriousness around a half point of sampling frequency known as a degradation portion in a modulation characteristic, at an input end of the digital frequency converter 2. This is due to the fact that the phase information of the QPSK signal is attenuated rapidly but not significantly as shown in FIG. 7, and the amplitude information of the QPSK signal is not attenuated even at a half point of the sampling frequency as shown in FIG. 8. FIG. 7 is a graph illustrating the spectrum of phase information of a QPSK signal expressed using 16-time sampling, with the transverse axis representing phase [π] and the longitudinal axis representing magnitude [dB]. FIG. 8 is a graph illustrating the spectrum of amplitude information of a QPSK signal), which is expressed using 16-time sampling, with the transverse axis representing frequency [MHz] and the longitudinal axis representing magnitude [dB].

Furthermore, in the above-mentioned embodiment, although conversion is executed in two divided phase conversion steps at the front end and the rear end of the interpolator 28 (i.e., through first phase conversion corresponding to frequency conversion of the conversion frequency f2 executed in the adder 24, and second phase conversion corresponding to frequency conversion of the conversion frequency f3 executed in the adder 29), all of the phase conversion corresponding to frequency conversion by desired conversion frequency f1 may be achieved by only one of the two-side phase conversion.

As described above, according to a digital frequency converter of the present invention, a sampling frequency of an input modulated signal is upsampled by the interpolator 21 and converted into phase information and amplitude information of a polar coordinate type by the phase detector 22 and the amplitude detector 23. The amplitude information becomes amplitude information output from the digital frequency converter. Meanwhile, phase change output from the accumulator 27 is added to the phase information output from the phase detector 22 using the adder 24. Therefore, phase change for frequency conversion, by which a frequency can be set in the frequency step of conversion frequency 'f1/$2^P$' (i.e., frequency conversion of the conversion frequency f2 corresponding to lower 'Q' figures [bit] from among the phase data PD for frequency conversion), is added to phase information output from the phase detector 22.

Also, a sampling frequency of phase information output from the adder 24 is upsampled by the interpolator 28, and phase change output from the accumulator 30 is added to phase information output from the interpolator 28 using the adder 29. Therefore, phase change for frequency conversion, by which a frequency can be set in the frequency step of conversion frequency 'f1/$2^{P-Q}$' (i.e., frequency conversion of the conversion frequency f3 corresponding to upper 'P-Q' figures [bit] from among the phase data PD for frequency conversion), is added to phase information output from the interpolator 28. Phase information output from the adder 29 is converted into discontinuous phase information represented in angles of 0 to 2π by means of the wrap circuit 31, and is input to the COS_ROM 32 and SIN_ROM 33 to generate phase-modulated signals Phase_I(t) and Phase_Q(t) of the orthogonal coordinate type. Herein, the phase-modulated signals Phase_I(t) and Phase_Q(t) become phase information output from the digital frequency converter.

Therefore, according to the digital frequency converter of the present invention, the phase information of a signal to be generated after frequency conversion in the case of increasing the frequency of an inputted modulated signal by the conversion frequency f1 (f1=f2+f3) is obtained as phase information output from the adder 29. The phase information can be output as phase-modulated signals Phase_I(t) and Phase_Q(t) of the orthogonal coordinate type from the digital frequency converter. Also, the phase information of a signal to be generated in the case of decreasing the frequency of an inputted modulated signal can be obtained by replacing the adders 24 and 29 with subtractors and by subtracting the phase change resulting from frequency conversion of conversion frequency f2 from the phase information or phase change resulting from frequency conversion of conversion frequency f3 from the phase information.

As described above, a digital frequency converter according to an embodiment of the present invention can easily achieve frequency conversion for the phase information of an inputted modulated signal using only simple adders/subtractors, without using a multiplier. To be specific, frequency conversion for a phase-modulated signal of the orthogonal coordinate type in the prior art requires four multipliers, one adder and one subtractor, where the present invention can easily achieve frequency conversion using only simple adders/subtractors. Such a construction lacking a multiplier reduces operational complexity, circuit size and power consumption.

In addition, with a digital frequency converter according to an embodiment of the present invention, frequency conversion is executed through two divided steps at the front end and the rear end of the interpolator 28 which performs 'MP1'-time upsampling for a sampling frequency, so that it is possible to lower an operational frequency of a circuit in front of the interpolator 28 according to a sampling frequency. To be specific, when frequency conversion for increasing a frequency is performed with only one-time execution, a sampling frequency is determined according to the signal. The sampling frequency is obtained after frequency conversion, so that the sampling frequency of a signal increases and thus the operational frequency of the digital frequency converter also increases. In contrast, when the frequency conversion is executed through two divided steps, one at the front end and one at the rear end of the interpolator 28 as described above, the adder 24 and the accumulator 27 can operate with a frequency of '1/MP1'.

Further, when the phase data PD for frequency conversion of 'P' bits, where P is a positive integer according to the desired conversion frequency f1 are calculated on the basis of the sampling frequency Fs3*p* of a signal outputted from the digital frequency converter, phase data of lower 'Q' bits are separated from the phase data PD for frequency conversion in the data separation unit 25, and the phase data of lower 'Q' bits are multiplied by 'MP1' in the data amplification unit 26, so that it is possible to reduce the length of operation language by one bit per two times in the accumulator 27.

Such reduction in the lengths of operational frequency and operation language reduces the size of the circuit for the digital frequency converter, thereby reducing power consumption.

In addition, a digital frequency converter according to the present invention, takes the sampling frequency of polar coordinate phase information and converts it into a phase-modulated signal of the orthogonal coordinate type. Therefore, conversion of a sampling frequency can be easily achieved through at least one-half processing, as compared to the conversion of a sampling frequency for a phase-modulated signal of the orthogonal coordinate type. To be specific, when converting a sampling frequency for an orthogonal coordinate phase-modulated signal, two filters for limiting an unnecessary frequency band are required, even when processing a baseband signal, to process a real-axis signal and an imaginary-axis signal. In addition, four filters are required for the processing of an IF signal.

In contrast, when converting a sampling frequency for polar coordinate phase information, only the phase information of a real-axis signal needs to be processed. This is true not only for the processing of a baseband signal but also for the processing of an IF signal. In effect, only one filter is required that limits an unnecessary frequency band when converting the sampling frequency.

Therefore, as compared with the prior art using the orthogonal coordinate type information, the amount of operation for a filter according to an embodiment of the present invention using the polar coordinate type is reduced by three quarters in the case of processing an IF signal and by half in the case of processing a baseband signal. Such a reduction in operational complexity reduces the size of circuit for the digital frequency converter, and therefore reduces power consumption.

Also, according to the digital frequency converter of the present invention, an output signal of the accumulator 30 is added to a signal of upper 'P-Q' bits from among an output signal of the interpolator 28 in the adder 29, so that it is possible to reduce the length of operation language of the adder 29 for a signal obtained after conversion of a sampling frequency, which inevitably increases when frequency conversion and sampling frequency conversion are executed for the phase information of an inputted modulated signal.

Therefore, by the reduction of the length of operation language, the size of the circuit for the digital frequency converter is reduced, thereby reducing power consumption.

In addition, according to the digital frequency converter of the present invention, since the sampling frequency of an inputted modulated signal is upsampled by the interpolator 21, aliasing may be prevented in the polar coordinate phase and amplitude information, even though the polar coordinate phase and amplitude information converted by the phase detector 22 and the amplitude detector 23 have a wider frequency bandwidth than that of the inputted modulated signal.

As a result, the digital frequency converter according to the present invention can produce output with reduced degradation in conversion error, noise, etc. while simultaneously providing a reduced circuit size and reduced power consumption.

While the present invention has been shown and described with reference to certain preferred embodiments thereof, it will be understood by those skilled in the art that various changes in form and details may be made therein without departing from the spirit and scope of the invention as defined by the appended claims.

What is claimed is:

1. A digital frequency converter comprising:
   a modulated-signal converter for converting an inputted modulated signal into phase information and amplitude information of a polar coordinate type, the modulated-signal converter outputting the phase information and the amplitude information;
   a phase calculation means for accumulatively adding phase data according to a desired conversion frequency;
   a phase converter for adding/subtracting an output signal of the phase calculation means to/from the phase information outputted from the modulated-signal converter, thereby generating phase information to be obtained when frequency conversion for the modulated signal is executed, the phase converter further outputting the phase information;
   a sampling frequency converter for converting a sampling frequency of the phase information outputted from the phase converter, the sampling frequency converter further outputting the phase information; and
   a phase-modulated signal generator for generating a phase-modulated signal on the basis of the phase information outputted from the sampling frequency converter, wherein the digital frequency converter outputs the phase information and the amplitude information.

2. A digital frequency converter comprising:
   a modulated-signal converter for converting an inputted modulated signal into phase information and amplitude information of a polar coordinate type, the modulated-signal converter outputting the phase information and the amplitude information;
   a phase calculation means for accumulatively adding phase data according to a desired conversion frequency;
   a sampling frequency converter for converting a sampling frequency of the phase information outputted from the modulated-signal converter, the sampling frequency converter further outputting the phase information;
   a phase converter for adding/subtracting an output signal of the phase calculation means to/from the phase information outputted from the sampling frequency converter, thereby generating phase information to be obtained when frequency conversion for the modulated signal is executed, the phase converter further outputting the phase information; and
   a phase-modulated signal generator for generating a phase-modulated signal on the basis of the phase information outputted from the phase converter, wherein the digital frequency converter outputs the phase information and the amplitude information.

3. A digital frequency converter comprising:

a modulated-signal converter for converting an inputted modulated signal into phase information and amplitude information of a polar coordinate type, the modulated-signal converter outputting the phase information and the amplitude information;

a first phase calculation means for accumulatively adding lower Q bits of P-bit phase data according to a desired conversion frequency, wherein P is a positive integer and Q is a positive integer that is less than P;

a second phase calculation means for accumulatively adding upper (P-Q) bits of the P-bit phase data according to a desired conversion frequency;

a first phase converter for adding/subtracting an output signal of the first phase calculation means to/from the phase information outputted from the modulated-signal converter, thereby generating phase information to be obtained when frequency conversion for the modulated signal is executed on the basis of lower Q bits of the P-bit phase data, the first phase converter further outputting the phase information;

a sampling frequency converter for converting a sampling frequency of the phase information outputted from the first phase converter, the sampling frequency converter further outputting the phase information;

a second phase converter for adding/subtracting an output signal of the second phase calculation means to/from phase information outputted from the sampling frequency converter, thereby generating phase information to be obtained when frequency conversion for the modulated signal is executed on the basis of the P-bit phase data, the second phase converter further outputting the phase information; and a phase-modulated signal generator for generating a phase-modulated signal on the basis of the phase information outputted from the second phase converter, wherein the digital frequency converter outputs the phase information and the amplitude information.

4. The digital frequency converter as claimed in claim 3, wherein the second phase converter adds/subtracts the output signal of the second phase calculation means to/from upper (P-Q) bits of a P-bit output signal from the sampling frequency converter.

5. The digital frequency converter of claim 1, further comprising an input sampling frequency converter for converting a sampling frequency of the inputted modulated signal, wherein the digital frequency converter converts the sampling frequency of the modulated signal and then converts the modulated signal into the phase information and the amplitude information of the polar coordinate type.

6. The digital frequency converter of claim 2, further comprising an input sampling frequency converter for converting a sampling frequency of the inputted modulated signal, wherein the digital frequency converter converts the sampling frequency of the modulated signal and then converts the modulated signal into the phase information and the amplitude information of the polar coordinate type.

7. The digital frequency converter of claim 3, further comprising an input sampling frequency converter for converting a sampling frequency of the inputted modulated signal, wherein the digital frequency converter converts the sampling frequency of the modulated signal and then converts the modulated signal into the phase information and the amplitude information of the polar coordinate type.

8. The digital frequency converter of claim 4, further comprising an input sampling frequency converter for converting a sampling frequency of the inputted modulated signal, wherein the digital frequency converter converts the sampling frequency of the modulated signal and then converts the modulated signal into the phase information and the amplitude information of the polar coordinate type.

* * * * *